(12) United States Patent
Rahimo et al.

(10) Patent No.: US 8,508,016 B2
(45) Date of Patent: Aug. 13, 2013

(54) BIPOLAR PUNCH-THROUGH SEMICONDUCTOR DEVICE AND METHOD FOR MANUFACTURING SUCH A SEMICONDUCTOR DEVICE

(75) Inventors: Munaf Rahimo, Uezwil (CH); Ulrich Schlapbach, Liebefeld (CH); Arnost Kopta, Zürich (CH)

(73) Assignee: ABB Technology AG, Zurich (CH)

( * ) Notice: Subject to any disclaimer, the term of this patent is extended or adjusted under 35 U.S.C. 154(b) by 70 days.

(21) Appl. No.: 13/160,945

(22) Filed: Jun. 15, 2011

(65) Prior Publication Data

US 2011/0278694 A1    Nov. 17, 2011

Related U.S. Application Data

(63) Continuation of application No. PCT/EP2009/057149, filed on Jun. 10, 2009.

(30) Foreign Application Priority Data

Dec. 15, 2008  (EP) .................................... 08171605

(51) Int. Cl.
*H01L 29/66* (2006.01)
(52) U.S. Cl.
USPC .................... 257/497; 438/542; 257/E21.135
(58) Field of Classification Search
USPC .......................... 257/497, E21.135; 438/542
See application file for complete search history.

(56) References Cited

U.S. PATENT DOCUMENTS 5,286,655 A    2/1994  Tsunoda
5,710,445 A *  1/1998  Bauer et al. .................. 257/147

FOREIGN PATENT DOCUMENTS

| DE | 2005 035 648 A1 | 2/2007 |
| EP | 0 466 101 A2 | 1/1992 |
| EP | 0 578 973 A1 | 1/1994 |
| EP | 0 700 095 A2 | 3/1996 |

OTHER PUBLICATIONS

Notification Concerning Transmittal of International Preliminary Report on Patentability (Forms PCT/IB/326 and PCT/IB/373) and the Written Opinion of the International Searching Authority (Form PCT/ISA/237) issued on Jun. 30, 2011, in the corresponding International Application No. PCT/EP2009/057149.
International Search Report (PCT/ISA/210) issued on Sep. 15, 2009, by European Patent Office as the International Searching Authority for International Application No. PCT/EP2009/057149.
Written Opinion (PCT/ISA/237) issued on Sep. 15, 2009, by European Patent Office as the International Searching Authority for International Application No. PCT/EP2009/057149.

* cited by examiner

*Primary Examiner* — Julio J Maldonado
*Assistant Examiner* — Robert Bachner
(74) *Attorney, Agent, or Firm* — Buchanan Ingersoll & Rooney PC

(57) ABSTRACT

A bipolar punch-through semiconductor device has a semiconductor substrate, which includes at least a two-layer structure, a first main side with a first electrical contact, and a second main side with a second electrical contact. One of the layers in the two-layer structure is a base layer of the first conductivity type. A buffer layer of the first conductivity type is arranged on the base layer. A first layer includes alternating first regions of the first conductivity type and second regions of the second conductivity type. The first layer is arranged between the buffer layer and the second electrical contact. The second regions are activated regions with a depth of at maximum 2 μm and a doping profile, which drops from 90% to 10% of the maximum doping concentration within at most 1 μm.

17 Claims, 6 Drawing Sheets

BIPOLAR PUNCH-THROUGH SEMICONDUCTOR DEVICE AND METHOD FOR MANUFACTURING SUCH A SEMICONDUCTOR DEVICE

RELATED APPLICATIONS

This application claims priority as a continuation application under 35 U.S.C. §120 to PCT/EP2009/057149, which was filed as an International Application on Jun. 10, 2009 designating the U.S., and which claims priority to European Application 08171605.2 filed in Europe on Dec. 15, 2008. The entire contents of these applications are hereby incorporated by reference in their entireties.

FIELD

The disclosure relates to the field of power electronics, such as a method for manufacturing a bipolar punch-through semiconductor device and to a bipolar punch-through semiconductor device.

BACKGROUND INFORMATION

Trends in power semiconductor devices have frequently targeted soft turn-off characteristics under switching transient conditions in order to minimize oscillations and reduce electromagnetic interference while also ensuring no peak overshoot voltages occurring during switching. The device softness can be associated with the total charge (excess carriers) remaining at the final phase during device turn-off. Low levels of charge or the sudden disappearance of charge while the device is turning off and while still conducting relatively high currents (>1 Amp) can result in large oscillations and/or an overshoot voltage which can exceed the device safe operating blocking voltage margin and thus result in device failure. The occurrence of large oscillations and/or an overshoot voltage due to low levels of charge or the sudden disappearance of charge while the device is turning off and while still conducting relatively high currents can be referred to as device snappy characteristics. The disappearance of charge is also related to the punch through voltage $V_{pth}$ of the device when the space charge region reaches the buffer region sweeping out all the remaining carriers stored during forward conduction. The $V_{pth}$ value is dependent on the base region thickness and resistivity and is normally close to the nominal DC link value (i.e. half the rated voltage) for medium to low voltage devices (<2000 V) and much lower for high voltage devices, which specify high resistivity base regions (>2000 V). The $V_{pth}$ is higher for thicker and/or lower resistivity base regions. To increase device softness, a number of conventional design technologies have been implemented in power devices as follows:

Increasing the punch through voltage by choosing thicker and/or lower resistivity base regions if permitted. An extreme example is the Non-Punch-Through (NPT) design. This approach can result in higher losses and high cosmic ray failure rates.

Introducing deep and low-doped buffer profiles to store charge in the higher doping parts of the buffer where the space charge region cannot reach in order to provide carriers for soft turn-off. The softness provided by using such buffer designs has shown limited effect under extreme switching conditions. Examples for such devices are devices with soft-punch-through (SPT) buffers.

Increasing the injection efficiency of the anode region in bipolar devices to provide additional excess carriers for softness. This practice can result in high turn-off losses and limits the device usage to low frequency applications.

Nevertheless, all the above technologies have proven to be ineffective in preventing snappy characteristics, since snappy behavior has persisted in modern low loss technology designs, which are normally based on very low punch-through voltage values due to the thin and high resistivity base regions. Furthermore, such designs can be very sensitive to extreme test conditions, which increase the tendency towards device snappy recovery including low currents, high dc-link voltages, low temperatures, high commutating current levels, and high stray inductance values.

An existing technology for achieving soft recovery performance in diodes has been implemented which includes highly doped P+ regions in an alternating arrangement with the N+ cathode regions of the main diode. The operating mechanism of this technology is based on the returning electrons during diode reverse recovery, which will flow near the P+N junctions towards the N+ cathode regions. This results in an increased lateral voltage drop at the P+N junctions which will exceed the built-in voltage of the P+N junction, hence causing hole injection from the P+ region. The injected or induced holes will provide charge for soft performance during the latest stages of reverse recovery independent of the device base region and buffer design parameters. Such designs included deep diffused, i.e. several microns thick, and highly doped alternating P+ and N+ regions with wide, i.e. larger than 500 μm, P+ region dimensions. It was also possible to have the P+ regions deeper than the N+ regions to increase the lateral electron flow and subsequent hole injection. The design has only been implemented for silicon fast recovery diodes since the basic principle and process was thought to be only applicable to bipolar devices with N+ cathode regions, i.e. diodes.

SUMMARY

An exemplary method is disclosed for manufacturing a bipolar punch-through semiconductor device with a semiconductor substrate, having at least a two-layer structure with layers of a first and a second conductivity type. a first main side, and a second main side, wherein one of the layers in the two-layer structure is a base layer of the first conductivity type, wherein the first main side is arranged opposite of the second main side, wherein a first electrical contact is arranged on the first main side, wherein a second electrical contact is arranged on the second main side, wherein a buffer layer of the first conductivity type is arranged on the base layer on the second main side, which buffer layer has a higher doping concentration than the base layer, wherein a first layer is arranged in the substrate between the buffer layer and the second electrical contact, the first layer having alternating regions including at least one first region of the first conductivity type and at least one second region of the second conductivity type. The manufacturing method comprises applying particles of the first conductivity type on the second main side to create the at least one first region; applying particles of the second conductivity type on the second main side to create the at least one second region; and activating the particles of the second conductivity type at such conditions that the particles diffuse into the substrate by not more than 2 μm and that the doping profile of the second region drops from 90% to 10% of the maximum doping concentration, to a distance within at most 1 μm, wherein at least one of the steps of the application of particles for the creation of the first region or the second region is performed through a mask.

An exemplary bipolar punch-through semiconductor device is disclosed comprising a semiconductor substrate, having at least a two-layer structure with layers of a first and a second conductivity type, a first main side, and a second main side, wherein one of the layers is a base layer of the first conductivity type, wherein the first main side is arranged opposite of the second main side, wherein a first electrical contact is arranged on the first main side, wherein a second electrical contact is arranged on the second main side, wherein a buffer layer of the first conductivity type is arranged on the base layer on the second main side, which buffer layer has a higher doping concentration than the base layer, wherein a first layer is arranged in the substrate between the buffer layer and the second electrical contact, the first layer having alternating regions including at least one first region of the first conductivity type and at least one second region of the second conductivity type, and wherein the second region is an activated region, which has a depth of at maximum 2 µm and a doping profile, which drops from a distance between 90% to 10% of the maximum doping concentration to a distance within at most 1 µm.

BRIEF DESCRIPTION OF DRAWINGS

The subject matter of the disclosure will be explained in more detail in the following text with reference to the attached drawings, in which.

The reference symbols used in the figures and their meaning are summarized in the list of reference symbols. Generally, alike or alike-functioning parts are given the same reference symbols. The described embodiments are meant as examples and shall not confine the disclosure.

DETAILED DESCRIPTION

Figure 1:
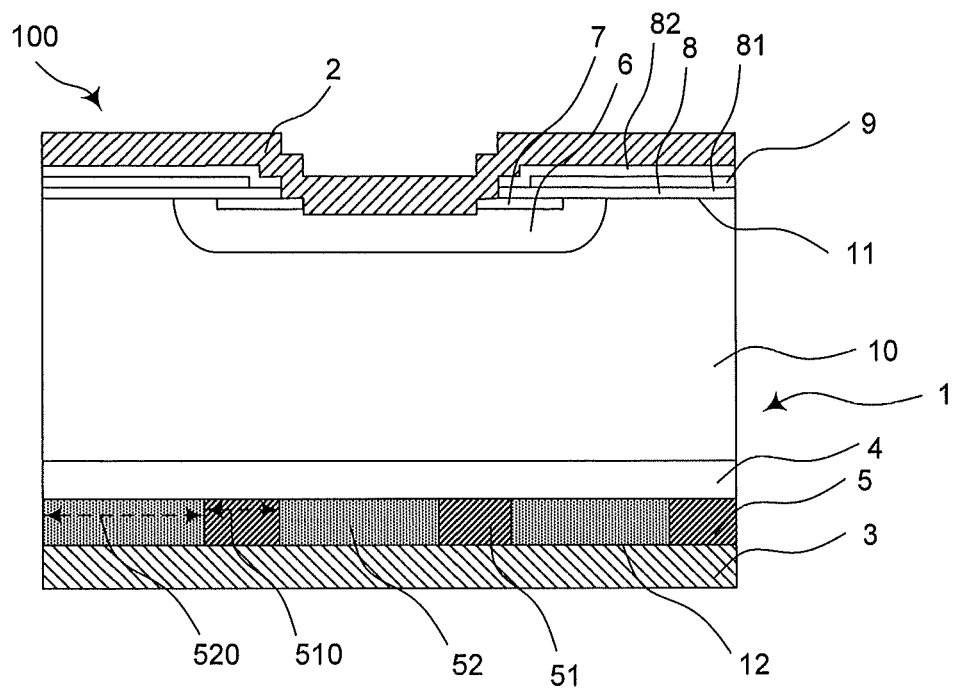
FIG. 1 shows a cross sectional view of a punch-through reverse-conducting IGBT with planar gate electrode in accordance with an exemplary embodiment.

A method is disclosed for manufacturing a bipolar punch-through semiconductor device, which can be less susceptible for on-state snap-back effects than known bipolar punch-through semiconductor devices and which can provide better control for the above mentioned electrical properties. A bipolar punch-through semiconductor device is also disclosed.

In an exemplary method, a bipolar punch-through semiconductor device with a semiconductor substrate is manufactured. The substrate comprises depending on the semiconductor type at least a two-layer structure with layers of a first and a second conductivity type, one of the layers being a base layer of the first conductivity type. The substrate comprises a first main side (e.g., emitter side), on which a first electrical contact is arranged, and a second main side (e.g., collector side), on which a second electrical contact is arranged. The first main side is arranged opposite of the second main side. A buffer layer of the first conductivity type is arranged on the base layer on the second main side, which buffer layer has a higher doping concentration than the base layer. A first layer can be arranged in the substrate between the buffer layer and the second electrical contact. The first layer comprises alternating regions including at least one first region of the first conductivity type and at least one second region of the second conductivity type. The second region can be an activated region, which has a depth of, for example, at maximum 2 µm and it has a doping profile, which drops within a distance between, for example, 90% to 10% of the maximum doping concentration within at most 1 µm.

Another exemplary embodiment is directed to a manufacturing method for manufacturing of the first layer of the bipolar punch-through semiconductor device the manufacturing method comprising providing a substrate of a first conductivity type implanting or depositing particles of the first conductivity type on the second main side to create a first region; and implanting or depositing particles of a second conductivity type on the second main side to create second region.

The particles of the second conductivity type are activated at such conditions that the particles diffuse into the substrate by, for example, not more than 2 µm and that the doping profile of the second region drops within a distance between 90% to 10% of the maximum doping concentration within at maximum 1 µm, and at least one of the creation of the first region or the implantation of the second particles being performed through a mask.

The operating mechanism is based on the same principle mentioned above for providing extra holes from P+ regions alternating with N+ regions in any power bipolar punch-through semiconductor device structure. This method allows the device design to be independent from the conventional design rules for increasing the $V_{pth}$ or anode injection efficiency resulting in more design freedom and thinner base regions closer to the semiconductor design limits for lower losses.

Figure 11:
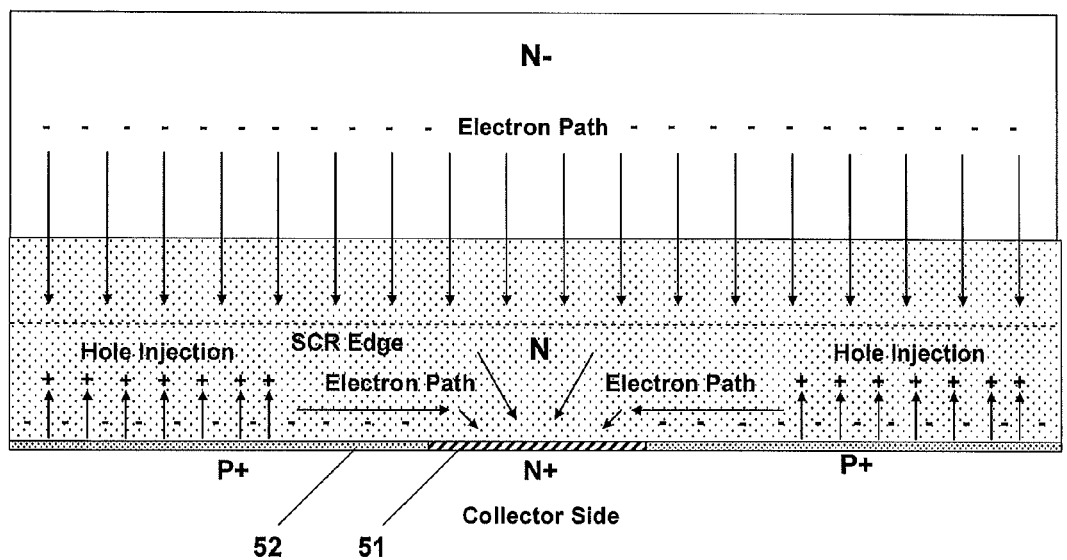
FIG. 11 shows the second main side (collector side) of a device with a buffer layer during turn-off in accordance with an exemplary embodiment.

An exemplary semiconductor device of the present disclosure is referred to as having a Turn-off Charge Induction (TCI) for soft turn-off switching. FIG. 11 shows the second main side (collector side) of an exemplary device with a buffer layer during turn-off in accordance with an exemplary embodiment. As shown in FIG. 11 shallow and highly doped regions of the second conductivity type with very steep P+N junction, e.g. p+ doped, alternating with regions of the first conductivity type, e.g. n+ doped, in a plane ensure that during turn-off the passing electrons induce a large potential across the P+ region junction forcing a controlled level of hole injection for soft turn-off. The dotted line in FIG. 11 marks the edge of the space charge region (SCR).

Figure 9:
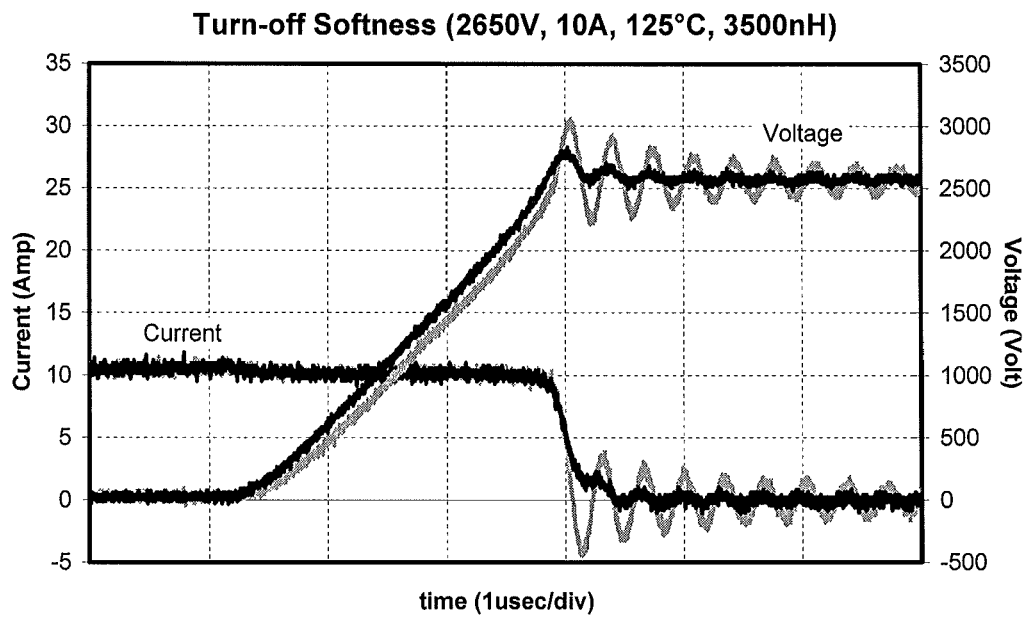
FIG. 9 shows the turn-off of a reverse conducting IGBT in transistor mode in accordance with an exemplary embodiment.

FIG. 9 shows the turn-off of a reverse conducting IGBT in transistor mode in accordance with an exemplary embodiment. FIG. 9 shows voltages and currents during turn-off of an exemplary reverse conducting IGBT in transistor mode (black line) in comparison to a prior art device (grey line). Both voltage and current show a much smoother behaviour of the exemplary device. The maximum overvoltage of the prior art device can be, for example, more than 3000 V, for example, and for the exemplary device it also can be, for example, less than 300V and more preferably, for example, less than 2800 V for the devices being operated at, for example, 2650 V.

Figure 10:
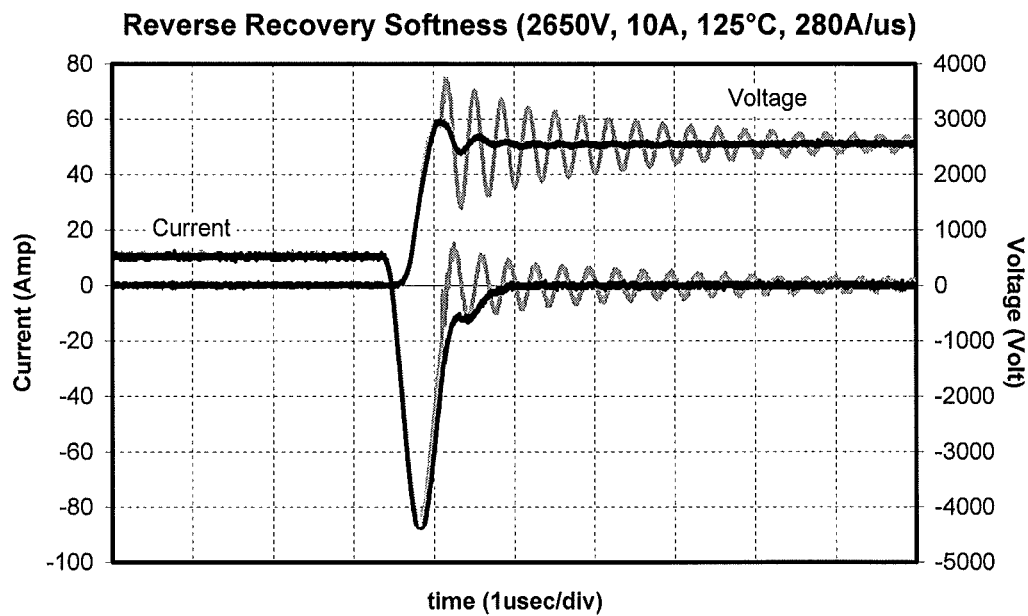
FIG. 10 shows the reverse recovery of a reverse conducting IGBT in transistor mode in accordance with an exemplary embodiment.

Similar results can be achieved for the reverse recovery of an exemplary reverse conducting IGBT in diode mode (black line) in comparison to a prior art device (grey line). FIG. 10 shows the reverse recovery of a reverse conducting IGBT in transistor mode in accordance with an exemplary embodiment. As shown in FIG. 10, overvoltages of, for example, about 3700 V can occur in a known device. For an exemplary semiconductor device of the present disclosure, however, smoother results can again be obtained with an overvoltage of, for example, at maximum 3000 V.

This applies to a broad variety of bipolar punch-though power semiconductor devices such as IGBTs, GCTs and diodes.

Figure 7:
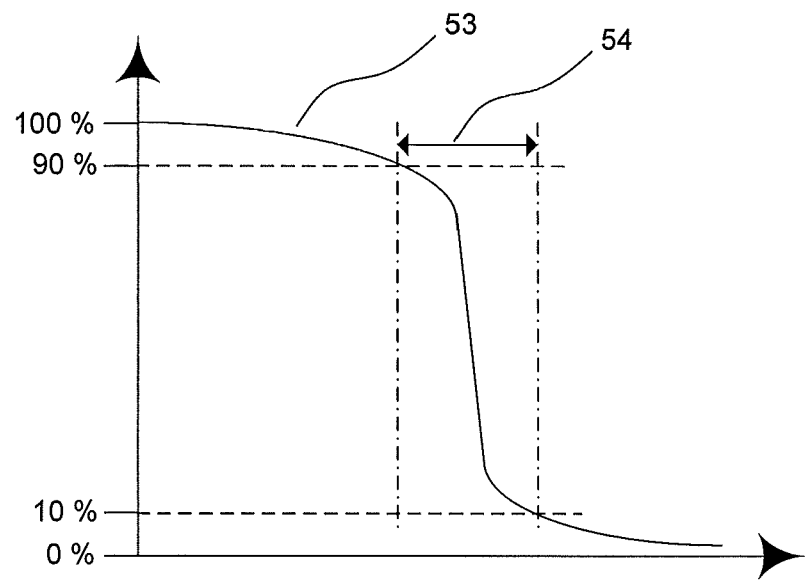
FIG. 7 shows the gradient of a doping concentration of the first or second region in depth direction in accordance with an exemplary embodiment.

An advantageous feature for enabling soft performance through the exemplary embodiments in this disclosure is different from known devices. For example, known devices use wide and deep P+ regions as a basis for achieving hole injection and soft performance. The exemplary embodiments of the present disclosure, however, are based at least in part on providing P+ regions with very steep doping profiles (abrupt junctions) alternating with N+ regions in a plane as shown in FIG. 7. The N+ regions can also shallow. The very steep P+N doping profiles provide a lower effective built-in voltage and higher lateral resistance for improved hole injection independent of the width of the P+ regions relative to the N+ region. This feature provides the exemplary embodiments of the present disclosure applicable with more design freedom in most power semiconductor devices.

To achieve such profiles, particles of the second conductivity type like Boron with high activation energy can be used, which have no or minimum diffusion occurring during the heat treatment, by which diffusion depth of up to or less than <1 μm can be achieved. Such abrupt doping profiles can be achieved with Boron particles in silicon substrates at temperatures, for example, below 1000° C., for example, for less than an hour or by laser annealing. The P+ type implant or deposition dose can vary, for example, from $1*10^{13}$ up to $1*10^{16}$ cm$^{-2}$, depending on the amount of charge needed for softness.

Figure 2:
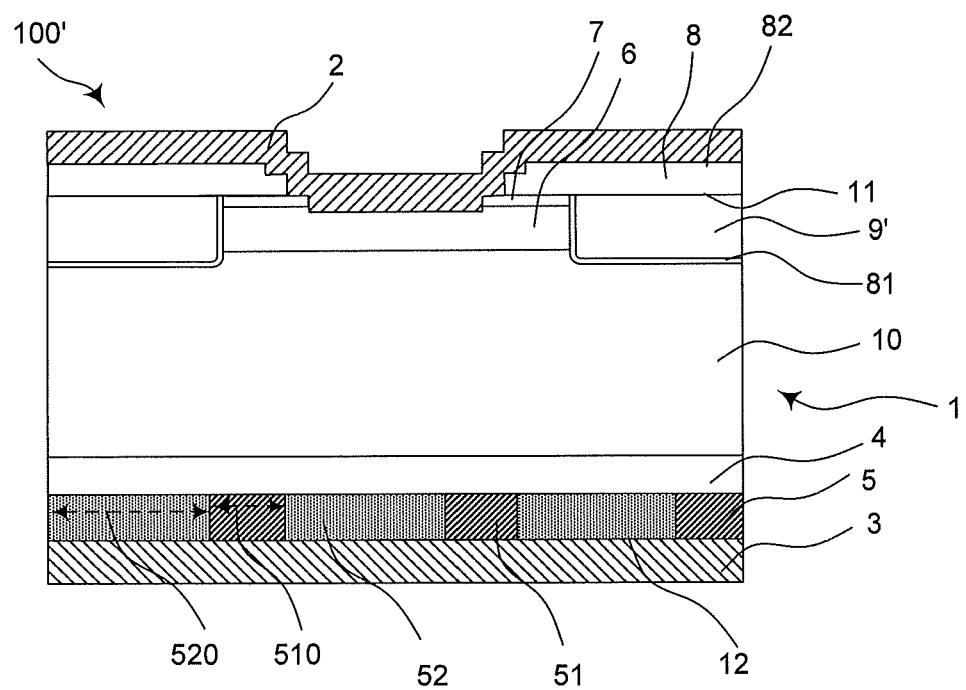
FIG. 2 shows a cross sectional view of a punch-through reverse-conducting IGBT with trench gate electrode in accordance with an exemplary embodiment.

An example for applying the disclosure is found in a Reverse Conducting semiconductor device, also called Reverse Conducting insulated gate bipolar transistor (RC-IGBT) for soft turn-off performance. An exemplary device is shown in FIGS. 1 and 2, in both transistor mode and diode mode, respectively. The concept can also be applied easily in normal insulated gate bipolar transistors (IGBTs) and gate commutated transistors (GCTs). In such bipolar devices, the P+ regions dimensions are wider relative to the alternating N+ regions on the same plane to ensure good bipolar action under normal conditions.

FIG. 1 shows a cross sectional view of a punch-through reverse-conducting IGBT with planar gate electrode in accordance with an exemplary embodiment. As shown in FIG. 1, a bipolar punch-through semiconductor device according to the present disclosure comprises a semiconductor substrate 1, also called semiconductor wafer, with a first main side 11 and a second main side 12. The second main side 12 is arranged opposite of the first main side 11. A first electrical contact 2 is arranged on the first main side 11, and a second electrical contact 3 is arranged on the second main side 12.

The device has at least a two-layer structure with layers of a first and a second conductivity type, one of the layers is a base layer 10 of the first conductivity type. A buffer layer 4 of the first conductivity type, which has a higher doping concentration than the base layer 10, is arranged on the base layer 10 on the second main side 12. A first layer 5 is arranged in the substrate 1 between the buffer layer 4 and the second electrical contact 12, the first layer 5 comprising alternating regions including at least one first region 51, 51' of the first conductivity type and at least one second region 52, 52' of the second conductivity type. The second region 52, 52' is an activated region, which has a depth of at maximum 2 μm and which second region has a doping profile 53, which drops within a distance 54, for example, from 90% to 10% of the maximum doping concentration within at most 1 μm in depth direction, i.e. between the second region 52 and the buffer layer 4, as visualized in FIG. 7. FIG. 7 shows the gradient of a doping concentration of the first or second region in depth direction in accordance with an exemplary embodiment In an exemplary embodiment of the present disclosure, the first region 51, 51' is a region, which has a depth of at maximum 2 μm. The first and/or second regions 51, 51', 52, 52' can be designed in a regular geometrical shape like in cells or stripes. The cells can have any shape like a square, rectangular or a circle or any other regular or irregular shape. The buffer layer 4 has a doping concentration of, for example, at maximum $5*10^{16}$ cm$^{-3}$.

Exemplary bipolar punch-through semiconductor devices can be bipolar switched, reverse conducting switches or diodes. Such bipolar punch-through semiconductor devices can for example be used in a converter.

Figure 8:
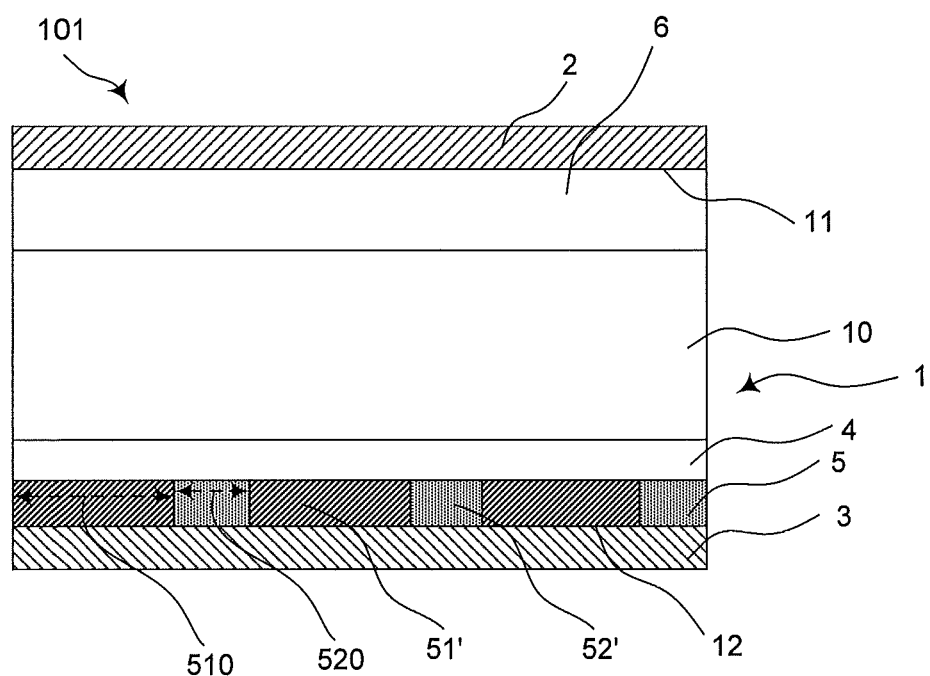
FIG. 8 shows a cross sectional view of a punch-through diode in accordance with an exemplary embodiment.

FIG. 8 shows a cross sectional view of a punch-through diode in accordance with an exemplary embodiment. The diode 101 comprises a base layer 10 of a first conductivity type, i.e. of n type, with a first main side 11 and a second main side 12 opposite the first main side 11. A second p doped layer 6 is arranged on the first main side 11. A first electrical contact 2, in form of a metal layer, for example, is arranged on top of the second layer 6, i.e. on that side of the second layer 6, which lies opposite the base layer 10. On the second main side 12, a plurality of first (n+) doped regions 51' with a higher doping concentration than the base layer 10 and a plurality of second (p+) doped regions 52', both of which regions are formed in an alternating arrangement. A second electrical contact 3, in the form of a metal layer is arranged on top of the first and second regions, i.e. on that side of the regions, which lies opposite the base layer 10. An (n+) doped buffer layer 4 is arranged between the base layer 10 and the first and second regions 51', 52'. This buffer layer 4 has a higher doping concentration than the base layer 10 and a lower doping concentration than the first regions 51'.

In an exemplary embodiment the total area of the all second (p+) doped regions 52' in the diode is between, for example, 1 and 25% of the total substrate area. The width of the first regions 51' can be at least 50 μm, whereas the width of the second regions 52' is at least 5 μm. Other suitable widths for the total area, first regions 51' and second regions 52' can be applied for achieving the objective of the present disclosure as desired.

The doping concentration of the buffer layer 4 is, for example, at maximum $5*10^{16}$/cm$^3$.

An exemplary bipolar punch-through semiconductor device can also be a bipolar switch, e.g. in form of a punch-through insulated gate bipolar transistor 100 is shown in FIG.

1. The insulated gate bipolar transistor 100 comprises an n type base layer 10 with a first main side 11 in form of an emitter side and a second main side 12 in form of a collector side opposite the emitter side. A p type second layer 6 is arranged on the emitter side. At least one n type source region 7 is arranged on the emitter side and is surrounded by the second layer 6. The at least one source region 7 has a higher doping than the base layer 10. An electrically insulating layer 8 is arranged on the emitter side on top of the base layer 10, the second layer 6, and the source region 7. The insulating layer at least partially covers the source region 7, the second layer 6, and the base layer 10. An electrically conductive gate electrode 9 is arranged on the emitter side electrically insulated from the at least one second layer 6, the source regions 7 and the base layer 10 by the electrically insulating layer 8. The gate electrode 9 can be embedded in the electrically insulating layer 8.

The electrically insulating layer 8 comprises a first electrically insulating region 81, made of a silicon dioxide, for example, and a second electrically insulating region 82, can also made of a silicon dioxide, and can be of the same material as the first electrically insulating region 81. The second electrically insulating region 82 covers the first electrically insulating region 81.

For an IGBT with a gate electrode formed as a planar gate electrode 9 as shown is FIG. 1 the first electrically insulating region 81 is arranged on top of the emitter side. In between the first and second electrically insulating regions 81, 82, which form the electrically insulating layer 8, the gate electrode 9 is embedded, and for example can be completely embedded between these insulating regions. Thus, the gate electrode 9 is separated from the base layer 10, the second layer 6, and the source regions 7 by the first electrically insulated region 81. The gate electrode 9 can be made of a heavily doped polysilicon or a metal like aluminum.

The at least one source region 7, the gate electrode 9 and the electrically insulating layer 8 are formed in such a way that an opening is created above the second layer 6. The opening is surrounded by the at least one source region 7, the gate electrode 9 and the electrically insulating layer 8.

A first electrical contact 2 is arranged on the emitter side within the opening so that it is in direct electrical contact to the second layer 6 and the source regions 7. This first electrical contact 2 can also covers the electrically insulating layer 8, but is separated and thus electrically insulated from the gate electrode 9 by the second electrically insulating region 82.

FIG. 2 shows a cross sectional view of a punch-through reverse-conducting IGBT with trench gate electrode in accordance with an exemplary embodiment. The trench gate electrode 9' is arranged in the same plane as the second layer 6 and adjacent to the source regions 7, separated from each other by a first insulating region 81, which also separates the gate electrode 9 from the base layer 10. A second insulating region 82 is arranged on top of the gate electrode formed as a trench gate electrode 9', thus insulating the trench gate electrode 9' from the first electrical contact 2.

The IGBT further comprises an n type buffer layer 4, which is arranged between the base layer 10 and the second electrical contact 3, which buffer layer 4 has a higher doping than the base layer 10 and a lower doping than the first region 51.

The at least one first and second region 51, 52 are arranged on the collector side between the buffer layer 4 and the second main electrode 3.

In exemplary embodiments of the present disclosure, at least one or more, or all of the following geometrical rules is fulfilled:
the total area of second regions 52 can be in an exemplary range of 90 to 99% of the total wafer area, or other suitable range as desired,
the width of the second region 52 is at least 50 μm, or other suitable width as desired, and
the width of the first region 51 is, for example, at least 5 μm, or other suitable width as desired.

In the case that the first region area is further enhanced to values of, for example, above 10 to 30% and the second region area can be reduced to below, for example, 90% to 70% of the whole substrate area, or other suitable value as desired, the insulated gate bipolar transistor acts as a reverse conducting semiconductor device (RC-IGBT).

In an exemplary RC-IGBT of the present disclosure a diode is formed between the first electrical contact 2, which forms an anode electrode in the diode, the second layer 6, part of which forms an anode layer, the base layer 10, part of which forms a base layer in the diode, the buffer layer 4, the first region 51, which region forms a cathode layer, and the second electrical contact 3, which forms a cathode electrode.

In the exemplary RC-IGBT an insulating bipolar transistor (IGBT) is formed between the first electrical contact 2, which forms an emitter electrode in the IGBT, the source region 7, the second layer 6, part of which forms a channel region, the base layer 10, part of which forms a base region in the IGBT, the buffer layer 4, the second region 52, which forms a collector layer, and the second electrical contact 3, part of which forms a collector electrode.

Figure 3:
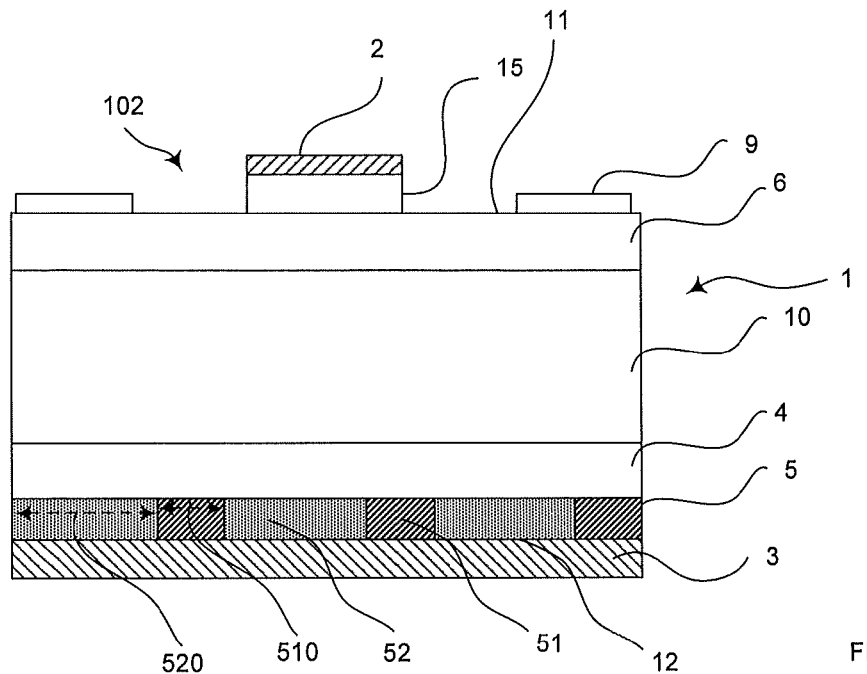
FIG. 3 shows a cross sectional view of a first IGCT in accordance with an exemplary embodiment.

In an exemplary embodiment, bipolar punch-through semiconductor device can also be a bipolar switch in form of a punch-through integrated gate commutated thyristor (IGCT). FIG. 3 shows a cross sectional view of a first IGCT in accordance with this exemplary embodiment In this embodiment, the semiconductor substrate comprises a four-layer structure (e.g., pnpn) with layers of different conductivity types. The structure defines an inner structure of a gate-commutated thyristor, which can be turned-off via a gate electrode. The structure comprises the following layers:
an outer doped (e.g., (n+) doped) cathode region 15 contacting the first electrical contact 2, which forms a cathode metallization,
a second doped (e.g., p doped) layer 6 with p impurities contacting the cathode region 15 on the side opposite the cathode metallization,
an doped (e.g., (n−) doped) base layer 10 contacting the second layer 6 on the side opposite the cathode region 15,
an doped (e.g., n doped) buffer layer 4 contacting the base layer 10 on the side opposite the second layer 6, and
a first layer 5 comprising first doped (e.g., n doped) regions 51 and second doped (e.g., p doped) regions 52 in form of an anode layer, both contacting the second electrical contact 3 in form of an anode metallization.

The gate electrode 9 is arranged on the cathode side of the substrate 1 and electrically contacts the second layer 6.

The at least one first and second region 51, 52 are arranged on the collector side between the buffer layer 4 and the second electrical contact 3.

In exemplary embodiments of the disclosure, at least one or more, or all of the following geometrical rules is fulfilled:
the total area of second regions 52 is, for example, 75 to 99% of the total substrate area, the width of the second region 52 is, for example, at least 50 μm, or the width of the first region 51 is, for example, at least 5 μm.

Figure 4:
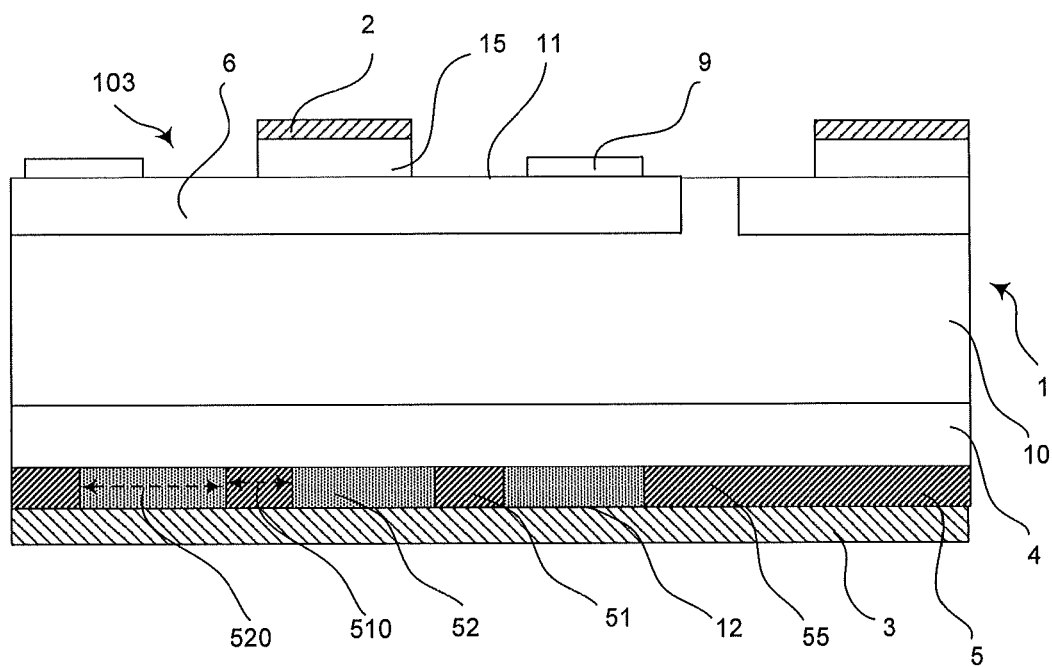
FIG. 4 shows a cross sectional view of a first IGCT according to an exemplary embodiment.
Figure 5:
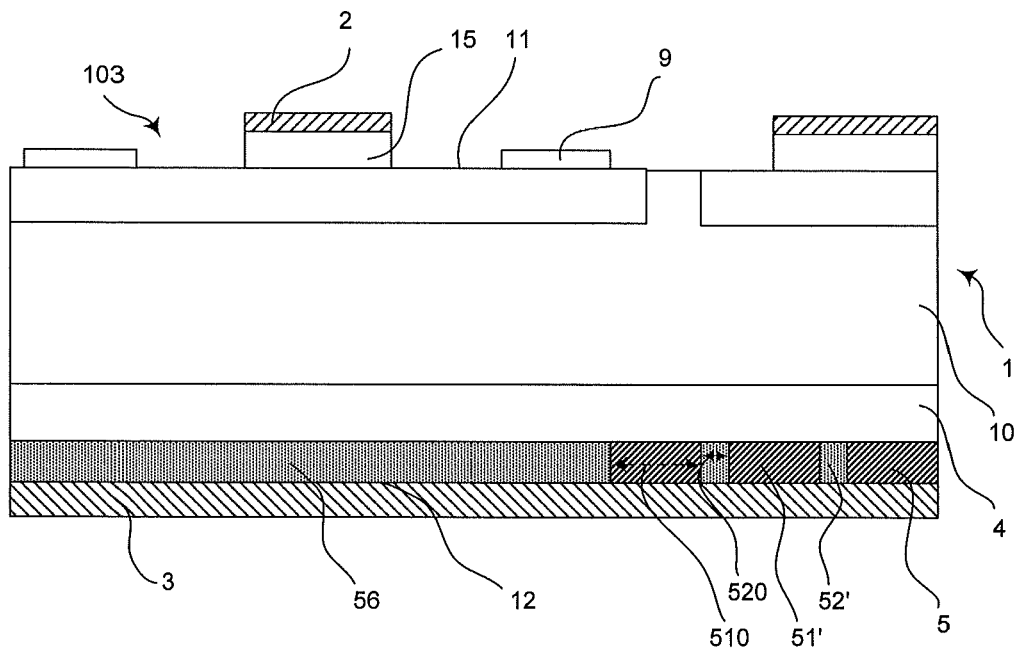
FIG. 5 shows a cross sectional view of a second IGCT according to an exemplary embodiment.
Figure 6:
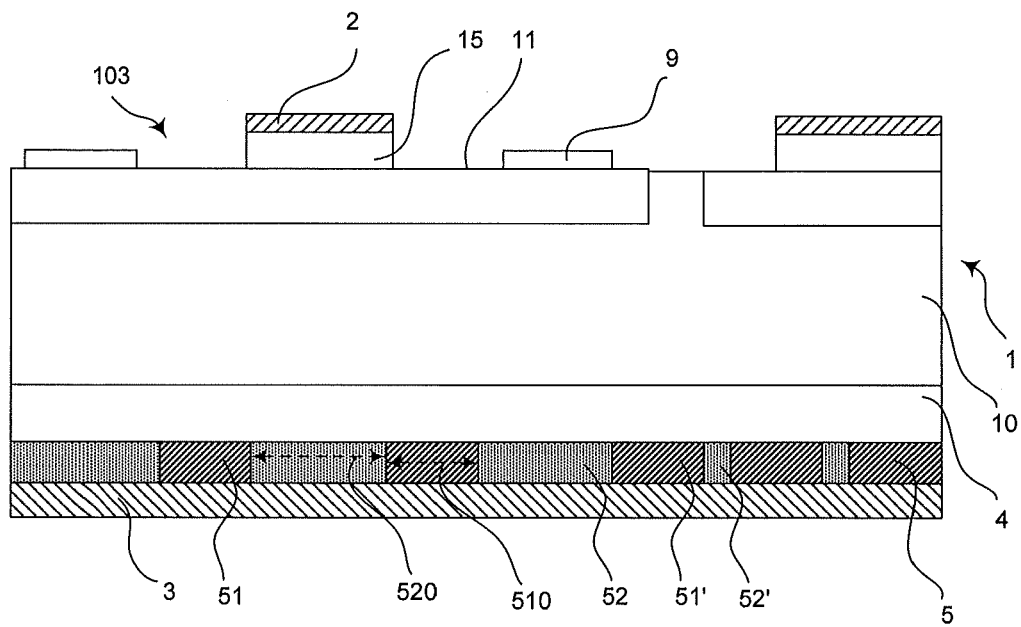
FIG. 6 shows a cross sectional view of a third IGCT in accordance with an exemplary embodiment.

In another exemplary embodiment, the bipolar punch-through semiconductor device can also be a reverse conducting punch-through integrated gate commutated thyristor as shown in the FIGS. 4 to 6.

Such a device comprises within one common substrate 1 an integrated gate commutated thyristor and adjacent to it, a freewheeling diode. FIG. 4 shows a cross sectional view of a first IGCT according to an exemplary embodiment. As shown in FIG. 4, the IGCT can comprise alternating first and second regions 51, 52, the second regions 52 having a total area of, for example, 75 to 99% of the total wafer area (FIG. 4), or other suitable value as desired, and the diode comprises a single n doped third region 55.

FIG. 5 shows a cross sectional view of a second IGCT according to an exemplary embodiment. As shown in FIG. 5, the diode can comprise alternating first and second regions 51', 52', the second regions 52' having a total area of, for example, 1 to 25% of the total wafer area (FIG. 5). In this case, the IGCT comprises a single p doped fourth region 56. In these cases, the first layer comprises the single third region 55 or the single fourth region 56, respectively.

FIG. 6 shows a cross sectional view of a third IGCT in accordance with an exemplary embodiment. As shown in FIG. 6, both the IGCT and the diode comprise alternating first and second regions 51, 52, 51', 52' according to the rules given above for the IGCT and the diode, respectively (FIG. 6).

For manufacturing an exemplary bipolar punch-through semiconductor device of the present disclosure, the layers on the first main side 11 are manufactured, resulting in a semi-fabricated semiconductor device.

Any manufacturing method, well-known to semiconductor experts, can be performed for the creation of these layers on the first main side 11.

In an exemplary embodiment, the layers on the second side 12 of the substrate 1 are manufactured after manufacturing the layers on the first side 11 either before or after creating the first electrical contact 2 or at any stage during the manufacturing of the layers on the second main side 12. The buffer layer can be manufactured before the first and second regions are created.

In the following, an exemplary method for fabricating the first layer 5 of the semiconductor device on the second main side 12 is explained. For the manufacturing of an exemplary bipolar punch-through semiconductor device a semiconductor substrate 1 is provided with a first main side 11 and a second main side 12 opposite of the first main side 11. The finalized semiconductor device comprises at least a two-layer structure with layers of a first and a second conductivity type, one of the layers being a base layer 10 of the first conductivity type. A first electrical contact 2 is arranged on the first main side 11 and a second electrical contact 3 is arranged on the second main side 12. A buffer layer 4 of the first conductivity type is arranged on the base layer 10 on the second main side 12, which buffer layer 4 has a higher doping concentration than the base layer 10. A first layer 5 is arranged in the substrate 1 between the buffer layer 4 and the second electrical contact 3, the first layer 5 comprising alternating regions including at least one first region 51, 51' of the first conductivity type and at least one second region 52, 52' of the second conductivity type.

An exemplary manufacturing method for the creation of the first layer 5 comprises the following steps: For the creation of the first region 51, 51' particles of the first conductivity type are applied, in particular by implantation or deposition, on the second main side 12. For the creation of the second region 52, 52' particles of the second conductivity type are applied also, for example, by implantation or deposition on the second main side 12. At least one of the steps of applying of particles of the first conductivity type or applying of particles of the second conductivity type is performed through a mask. The particles of the second conductivity type are afterwards activated at such conditions that the particles diffuse into the substrate 1 by not more than 2 μm and that the doping profile of the second region drops from, for example, 90% to 10% of the maximum doping concentration, or other suitable percentage as desired, to within at most 1 μm.

In an exemplary embodiment, the particles of the first conductivity type are activated at such conditions that the particles diffuse into the substrate 1 by not more than 2 μm.

In other exemplary embodiments, at least one or a plurality or all of the following geometrical rules is fulfilled:

the first region 51, 51' is created such that the doping profile of the first region 51 drops from, for example, 90% to 10% of the maximum doping concentration, or other suitable value as desired, to within at maximum 1 μm, the depth of the first region 51, 51' is equal to or higher than the depth of the second region 52, 52'.

The particles for the creation of the first region 51, 51' or the second region 52, 52' or both regions 51, 51', 52, 52' are implanted or deposited. The doping concentration for the particles for the creation of the first region 51, 51' is, for example, $1*10^{17}$ up to $1*10^{20}$ cm$^{-3}$, whereas the doping concentration for the particles for the creation of the second region 52, 52' is, for example, $1*10^{16}$ up to $1*10^{18}$ cm$^{-3}$.

Depending of the semiconductor device type to be manufactured the total areas of the first and second regions are varied, in particular accordingly to the values given above for the various exemplary semiconductor types.

The particles for the creation of the first region 51, 51' or the second region 52, 52' or both regions 51, 51', 52, 52' can be activated by laser annealing or by a heat treatment. The heat treatment is performed at a temperature between, for example, 400° C. and 1000° C. and/or for at most 60 min. The particles for the creation of the first region 51, 51' and the second region 52, 52' can be activated simultaneously or alternatively, the particles can be activated consecutively for one layer after the other.

The particles for the creation of the second region are Boron particles, as Boron particles have high activation energy with no or minimum diffusion occurring.

For finalizing the bipolar punch-through semiconductor device a second electrical contact 3 is created on the second main side 12 on the first and second regions 51, 51', 52, 52' and if applicable the third or fourth region 55, 56 so that the second electrical contact 3 is in direct electrical contact to the first and second regions 51, 51', 52, 52' (and if applicable the third or fourth region 55, 56). Metal can be deposited on the second main side 12 for creating the second electrical contact 3.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST 1 substrate
10 base layer 11 first main side
12 second main side
15 cathode region
100, 100' IGBT
101 diode
102 IGCT
103 RC-IGCT
2 first electrical contact
3 second electrical contact
4 buffer layer
5 first layer
51, 51' first region
510 first region depth
52, 52' second region
520 second region depth
53 doping profile
54 doping profile drop
55 third region
56 fourth region
6 second layer
7 source region
8 electrically insulating layer
81 first electrically insulating region
82 second electrically insulating region
9, 9' gate electrode

What is claimed is:

1. A method for manufacturing a bipolar punch-through semiconductor device with a semiconductor substrate, having at least a two-layer structure with layers of a first and a second conductivity type, a first main side, and a second main side, wherein one of the layers in the two-layer structure is a base layer of the first conductivity type,
   wherein the first main side is arranged opposite of the second main side,
   wherein a first electrical contact is arranged on the first main side,
   wherein a second electrical contact is arranged on the second main side,
   wherein a buffer layer of the first conductivity type is arranged on the base layer on the second main side, which buffer layer has a higher doping concentration than the base layer,
   wherein a first layer is arranged in the substrate between the buffer layer and the second electrical contact, the first layer having alternating regions including at least one first region of the first conductivity type and at least one second region of the second conductivity type,
   the manufacturing method comprising:
   applying particles of the first conductivity type on the second main side to create the at least one first region;
   applying particles of the second conductivity type on the second main side to create the at least one second region; and
   activating the particles of the second conductivity type at such conditions that the particles diffuse into the substrate by not more than 2 µm and that the doping profile of the second region drops from 90% to 10% of the maximum doping concentration, to a distance within at most 1 µm,
   wherein at least one of the steps of the application of particles for the creation of the first region or the second region is performed through a mask.

2. The method device according to claim 1, wherein the particles of the first conductivity type are activated at such conditions that the particles diffuse into the substrate by not more than 2 µm.

3. The method according to claim 1, wherein at least one of the following geometrical rules is fulfilled:
   the first region is created such that the doping profile of the first region drops from 90% to 10% of the maximum doping concentration within at maximum 1 µm, and the depth of the first region is equal to or higher than the depth of the second region.

4. The method according to claim 1, wherein
   the particles for the creation of at least one of the regions, which regions are the first region and the second region, are applied with a doping concentration of $1*10^{17}$ up to $1*10^{20}$ cm$^{-3}$ for the particles for the creation of the first region and/or $1*10^{16}$ up to $1*10^{18}$ cm$^{-3}$ for the particles for the creation of the second region.

5. The method according to claim 1, wherein the particles for the creation of at least one of the first region and the second region are activated by laser annealing or by a heat treatment at a temperature between 400° C. and 1000° C., and at most 60 min,
   wherein the particles for the creation of the first region and the second region are activated simultaneously or sequentially.

6. A bipolar punch-through semiconductor device comprising:
   a semiconductor substrate, having at least a two-layer structure with layers of a first and a second conductivity type, a first main side, and a second main side, wherein one of the layers is a base layer of the first conductivity type,
   wherein the first main side is arranged opposite of the second main side,
   wherein a first electrical contact is arranged on the first main side,
   wherein a second electrical contact is arranged on the second main side,
   wherein a buffer layer of the first conductivity type is arranged on the base layer on the second main side, which buffer layer has a higher doping concentration than the base layer,
   wherein a first layer is arranged in the substrate between the buffer layer and the second electrical contact, the first layer having alternating regions including at least one first region of the first conductivity type and at least one second region of the second conductivity type, and
   wherein the second region is an activated region, which has a depth of at maximum 2 µm and a doping profile, which drops from a distance between 90% to 10% of the maximum doping concentration, to a distance within at most 1 µm.

7. The bipolar punch-through semiconductor device according to claim 6, wherein the first region is a region, which has a depth of at maximum 2 µm.

8. The bipolar punch-through semiconductor device according to claim 6, wherein the first and/or second regions have a geometrical shape of one of cells or stripes.

9. The bipolar punch-through semiconductor device according to claim 6, wherein the buffer layer has a doping concentration of at most $5*10^{16}$ cm$^{-3}$.

10. The bipolar punch-through semiconductor device according to claim 6, wherein the bipolar device is a bipolar switch that includes one of: an insulated gate bipolar transistor or a insulated gate commutated thyristor.

11. The bipolar punch-through semiconductor device according to claim 10, wherein at least one of the following geometrical rules is fulfilled:
   the width of the second region is at least 50 µm;
   the width of the first region is at least 5 µm;

the total area of second regions is between 75 to 99% of the total substrate area in the case of the semiconductor device being an insulated gate commutated thyristor; and the total area of second regions is between 90 to 99% of the total wafer area in the case of the semiconductor device being an insulated gate bipolar transistor.

12. The bipolar punch-through semiconductor device according to claim 6, wherein the bipolar device is a bipolar diode.

13. The bipolar punch-through semiconductor device according to claim 12, wherein at least one of the following geometrical rules is fulfilled:
the total area of second regions is 1 to 25% of the total wafer area;
the width of the first region is at least 50 µm; and
the width of the second region is at least 5 µm.

14. The bipolar punch-through semiconductor device according to claim 6, wherein the semiconductor device is a reverse-conducting semiconductor device comprising a insulated gate bipolar transistor and a diode on a common substrate, wherein the total area of second regions is 70 to 90% of the total substrate area.

15. A bipolar diode, comprising:
a semiconductor substrate, having at least a two-layer structure with layers of a first and a second conductivity type, a first main side, and a second main side, wherein one of the layers is a base layer of the first conductivity type,
wherein the first main side is arranged opposite of the second main side,
wherein a first electrical contact is arranged on the first main side,
wherein a second electrical contact is arranged on the second main side,
wherein a buffer layer of the first conductivity type is arranged on the base layer on the second main side, which buffer layer has a higher doping concentration than the base layer,
wherein a first layer is arranged in the substrate between the buffer layer and the second electrical contact, the first layer having alternating regions including at least one first region of the first conductivity type and at least one second region of the second conductivity type,
wherein the second region is an activated region, which has a depth of at maximum 2 µm and a doping profile, which drops from a distance between 90% to 10% of the maximum doping concentration, to a distance within at most 1 µm,
wherein at least one of the following geometrical rules is fulfilled:
the total area of second regions is 1 to 25% of the total wafer area;
the width of the first region is at least 50 µm; and
the width of the second region is at least 5 µm.

16. An insulated gate bipolar transistor comprising:
a semiconductor substrate, having at least a two-layer structure with layers of a first and a second conductivity type, a first main side, and a second main side, wherein one of the layers is a base layer of the first conductivity type,
wherein the first main side is arranged opposite of the second main side,
wherein a first electrical contact is arranged on the first main side,
wherein a second electrical contact is arranged on the second main side,
wherein a buffer layer of the first conductivity type is arranged on the base layer on the second main side, which buffer layer has a higher doping concentration than the base layer,
wherein a first layer is arranged in the substrate between the buffer layer and the second electrical contact, the first layer having alternating regions including at least one first region of the first conductivity type and at least one second region of the second conductivity type, and
wherein the second region is an activated region, which has a depth of at maximum 2 µm and a doping profile, which drops from a distance between 90% to 10% of the maximum doping concentration, to a distance within at most 1 µm, and
wherein at least one of the following geometrical rules is fulfilled:
the width of the second region is at least 50 µm;
the width of the first region is at least 5 µm; and
the total area of second regions is between 90 to 99% of the total wafer area in the case of the semiconductor device being an insulated gate bipolar transistor.

17. An insulated gate commutated thyristor, comprising:
a semiconductor substrate, having at least a two-layer structure with layers of a first and a second conductivity type, a first main side, and a second main side, wherein one of the layers is a base layer of the first conductivity type,
wherein the first main side is arranged opposite of the second main side,
wherein a first electrical contact is arranged on the first main side,
wherein a second electrical contact is arranged on the second main side,
wherein a buffer layer of the first conductivity type is arranged on the base layer on the second main side, which buffer layer has a higher doping concentration than the base layer,
wherein a first layer is arranged in the substrate between the buffer layer and the second electrical contact, the first layer having alternating regions including at least one first region of the first conductivity type and at least one second region of the second conductivity type, and
wherein the second region is an activated region, which has a depth of at maximum 2 µm and a doping profile, which drops from a distance between 90% to 10% of the maximum doping concentration, to a distance within at most 1 µm, and
wherein at least one of the following geometrical rules is fulfilled:
the width of the second region is at least 50 µm;
the width of the first region is at least 5 µm; and
the total area of second regions is between 75 to 99% of the total substrate area in the case of the semiconductor device being an insulated gate commutated thyristor.

* * * * *